(12) United States Patent
Dutta et al.

(10) Patent No.: US 11,444,160 B2
(45) Date of Patent: Sep. 13, 2022

(54) INTEGRATED CIRCUIT (IC) STRUCTURE WITH BODY CONTACT TO WELL WITH MULTIPLE DIODE JUNCTIONS

(71) Applicant: GLOBALFOUNDRIES U.S. Inc., Santa Clara, CA (US)

(72) Inventors: Anupam Dutta, Bangalore (IN); Venkata N. R. Vanukuru, Bangalore (IN); John J. Ellis-Monaghan, Grand Isle, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 20 days.

(21) Appl. No.: 17/155,182

(22) Filed: Jan. 22, 2021

(65) Prior Publication Data
US 2022/0190116 A1 Jun. 16, 2022

(30) Foreign Application Priority Data
Dec. 11, 2020 (IN) .............................. 202011053953

(51) Int. Cl.
*H01L 29/10* (2006.01)
*H01L 21/761* (2006.01)
*H01L 21/762* (2006.01)
*H01L 29/08* (2006.01)
*H01L 29/861* (2006.01)

(52) U.S. Cl.
CPC ........ *H01L 29/1095* (2013.01); *H01L 21/761* (2013.01); *H01L 21/76224* (2013.01); *H01L 29/0847* (2013.01); *H01L 29/861* (2013.01)

(58) Field of Classification Search
CPC ............. H01L 29/7841; H01L 29/0603; H01L 29/0642; H01L 29/0649; H01L 27/0928; H01L 27/098; H01L 27/0811; H01L 27/0814; H01L 27/1021; H01L 2027/11855; H01L 29/78; H01L 29/7849; H01L 29/80; H01L 29/1095; H01L 29/0684; H01L 29/0688
See application file for complete search history.

(56) References Cited

U.S. PATENT DOCUMENTS

| | | |
|---|---|---|
| 5,559,368 A | 9/1996 | Hu et al. |
| 5,959,324 A | 9/1999 | Kohyama |
| 6,091,101 A | 7/2000 | Wang |
| 6,194,776 B1 | 2/2001 | Amano et al. |
| 6,274,898 B1 | 8/2001 | Mehta et al. |
| 6,404,036 B2 | 6/2002 | Maruyama |
| 6,661,042 B2 | 12/2003 | Hsu |
| 6,806,133 B2 | 10/2004 | Oh |

(Continued)

*Primary Examiner* — Sonya McCall-Shepard
(74) *Attorney, Agent, or Firm* — Francois Pagette; Hoffman Warnick LLC

(57) ABSTRACT

The disclosure provides an integrated circuit (IC) structure with a body contact to a well with multiple diode junctions. A first doped well is in a substrate. A transistor is on the first doped well. A trench isolation (TI) is adjacent a portion of the first doped well. A second doped well within the substrate has a bottom surface beneath a bottom surface of the first doped well. A sidewall of the TI horizontally abuts the second doped well. A first diode junction is between the second doped well and the first doped well. A second diode junction is between the second doped well and the substrate. A body contact is on the second doped well.

19 Claims, 13 Drawing Sheets

(56) References Cited

U.S. PATENT DOCUMENTS

| | | |
|---|---|---|
| 6,875,650 B2 | 4/2005 | Salling et al. |
| 6,919,236 B2 | 7/2005 | Wei et al. |
| 7,551,511 B2 | 6/2009 | Lee |
| 8,487,383 B2 | 7/2013 | Park et al. |
| 8,817,548 B2 | 8/2014 | Widjaja et al. |
| 9,136,157 B1 | 9/2015 | Kar-Roy et al. |
| 2007/0133289 A1 | 6/2007 | Ma et al. |
| 2010/0001351 A1 | 1/2010 | Zhang et al. |
| 2018/0158912 A1* | 6/2018 | Han ................ H01L 27/1203 |
| 2019/0043856 A1* | 2/2019 | Agam ................ H01L 29/861 |

* cited by examiner

INTEGRATED CIRCUIT (IC) STRUCTURE WITH BODY CONTACT TO WELL WITH MULTIPLE DIODE JUNCTIONS

TECHNICAL FIELD

Embodiments of the disclosure relate generally to integrated circuit (IC) structures. More specifically, various embodiments of the disclosure provide an IC structure with a body contact to a well having multiple diode junctions.

BACKGROUND

In the microelectronics industry as well as in other industries involving construction of microscopic structures, there is a continued desire to reduce the size of structural features and microelectronic devices and/or to provide a greater amount of circuitry for a given chip size. Miniaturization in general allows for increased performance (more processing per clock cycle and less heat generated) at lower power levels and lower cost. Present technology is at atomic level scaling of certain micro-devices such as logic gates, FETs, and capacitors. Circuit chips with millions of such devices are common.

Circuit fabricators are currently seeking to reduce the two-dimensional area occupied by device components, e.g., to reduce two dimensional area and power consumption. One concern of miniaturization of digital circuits featuring field effect transistors (FETs) has been the electrical biasing of transistor body terminals, i.e., electrically active regions beneath the source, drain, channel, and gate of the FET. Body biasing of a FET may affect voltage gain and/or linearity of the intended input-output voltage function in a circuit component. In conventional designs, effective biasing of the FET body may require forming several (i.e., three or more) distinct wells. This approach uses significant area, and may not be feasible in many devices or technical settings. Moreover, such transistor structures often fail to provide sufficient voltage gain, or reliable electrical operation, in some technical settings.

SUMMARY

Aspects of the present disclosure provide an integrated circuit (IC) structure, including: a first doped well within a substrate, the first doped well having a first doping type; a transistor structure on the first doped well; a trench isolation (TI) adjacent a portion of the first doped well; and a second doped well within the substrate and coupled to a body contact, the second doped well having a second doping type opposite the first doping type, wherein a sidewall of the TI horizontally abuts the second doped well, a vertical boundary between the second doped well and the first doped well defines a first diode junction, and a vertical boundary between the second doped well and the substrate defines a second diode junction.

Further aspects of the present disclosure provide an integrated circuit (IC) structure, including: a first doped well within a substrate, the first doped well having a first doping type; a transistor structure on the first doped well; a trench isolation (TI) adjacent a portion of the first doped well; a second doped well within the substrate, the second doped well having a second doping type opposite the first doping type, wherein the second doped well includes: a first portion beneath the first doped well, wherein a vertical boundary between the first portion of the second doped well and the first doped well defines a first diode junction, and a vertical boundary between the first portion of the second doped well and the substrate defines a second diode junction, and a second portion coupled to a body contact and having a bottom surface substantially coplanar with a bottom surface of the first portion, wherein the second portion includes a sidewall adjacent the first portion of the second doped well and adjacent the TI.

Yet another aspect of the present disclosure provides a method of forming an integrated circuit (IC) structure, the method including: forming a first doped well of a first doping type within a substrate; forming a trench isolation (TI) within the substrate adjacent a sidewall of the first doped well; forming a second doped well of a second doping type within the substrate, wherein a vertical boundary between the first portion of the second doped well and the first doped well defines a first diode junction, and a vertical boundary between the first portion of the second doped well and the substrate defines a second diode junction; forming a transistor structure on the first doped well; and forming a body contact to the second portion of the second doped well.

BRIEF DESCRIPTION OF THE DRAWINGS

These and other features of this disclosure will be more readily understood from the detailed description of the various aspects of the disclosure taken in conjunction with the accompanying drawings that depict various embodiments of the disclosure, in which.

Figure 1:
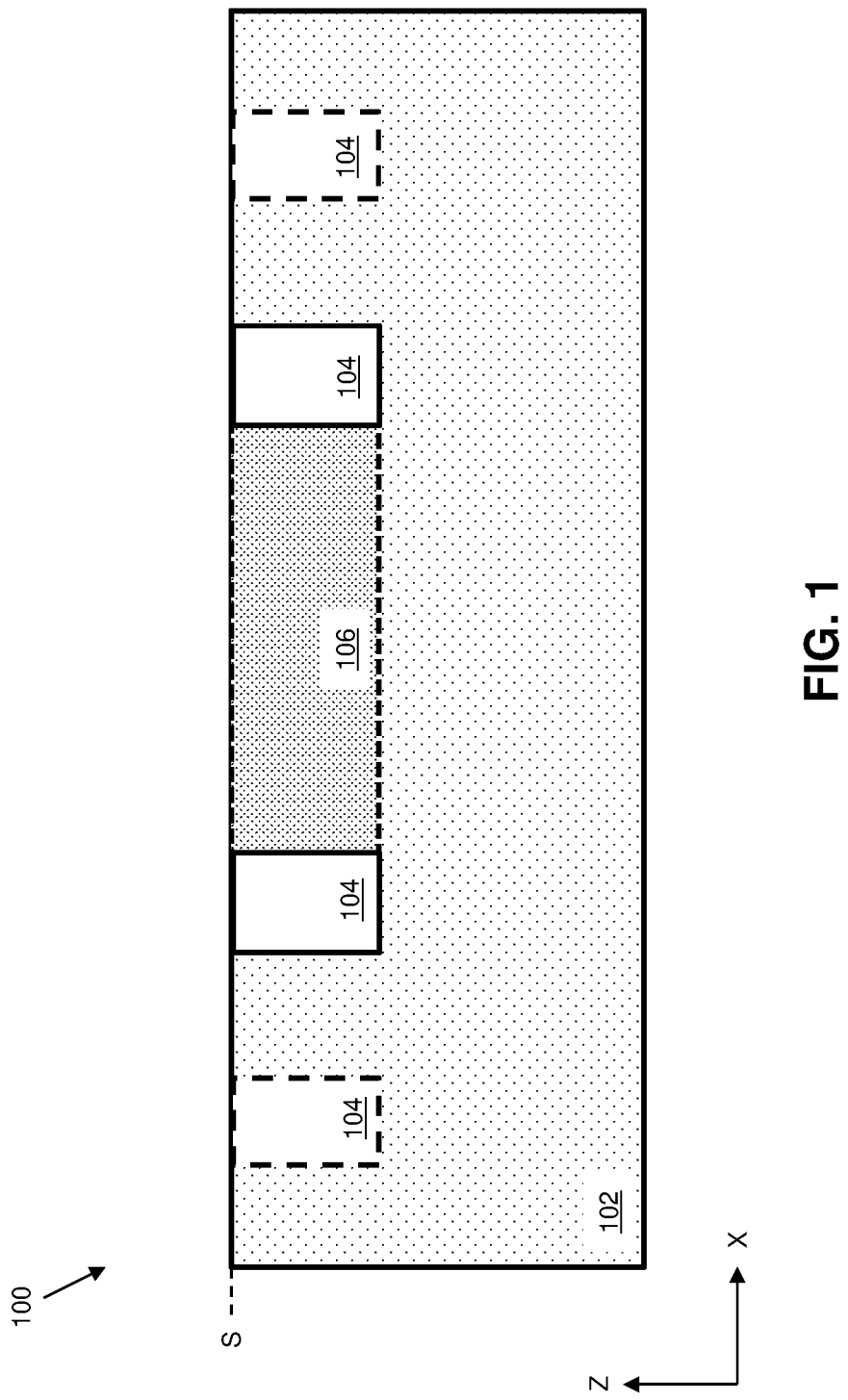
FIG. 1 provides a cross-sectional view of forming a first doped well and trench isolations (TIs) in a substrate in methods according to the disclosure.

It is noted that the drawings of the disclosure are not necessarily to scale. The drawings are intended to depict typical aspects of the disclosure, and therefore should not be considered as limiting the scope of the disclosure. In the drawings, like numbering represents like elements between the drawings.

DETAILED DESCRIPTION

In the description herein, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made within the scope of the present teachings. The description herein is, therefore, merely illustrative.

Embodiments of the disclosure provide an integrated circuit (IC) structure with a body contact to a doped well having multiple diode junctions. The IC structure may be formed on a substrate, e.g., a bulk region of semiconductor material. The substrate may have a first doped well of a first doping type, in which a top surface of the first doped well is substantially coplanar (e.g., flush) with the top surface of the substrate. A transistor may be on the first doped well, and furthermore may include source, drain, and channel regions that are within the first doped well. One or more trench isolations (TIs) may be within the first doped well. A second doped well, also within the substrate, may have a second doping type that is opposite the first doping type. A bottom surface of the second doped well may be below the bottom surface of the first doped well. A vertical boundary between the first doped well and the second doped well defines a first diode junction, while a vertical boundary between the second doped well and the substrate defines a second diode junction. A body contact, coupled to the second doped well, allows for electrical biasing of the first doped well beneath the transistor through the diode junction(s). Embodiments of the disclosure also include methods to form an IC structure with a body contact to a second doped well with diode junctions.

Referring to FIG. 1, a cross-sectional view of a preliminary structure 100 according to embodiments of the disclosure is shown. Preliminary structure 100 may be suitable to form various IC structures in various methods according to embodiments of the disclosure, and various processing methodologies are discussed herein. Preliminary structure 100 may have a substrate 102 including, e.g., one or more semiconductor materials. Substrate 102 can include any currently known or later-developed semiconductor material, which may include without limitation, silicon, germanium, silicon carbide, and those including essentially of one or more III-V compound semiconductors having a composition defined by the formula $Al_{X1}Ga_{X2}In_{X3}As_{Y1}P_{Y1}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The entirety of substrate 102 or a portion thereof may be strained. Substrate 102 may include a layer of bulk silicon, but in further embodiments may take the form of a semiconductor on insulator (SOI) substrate, a semiconductor fin, and/or other types of substrates. Substrate 102 may have a top surface S, on which subsequent components (e.g., masks, contacts, transistors, etc.) are formed.

Figure 7:
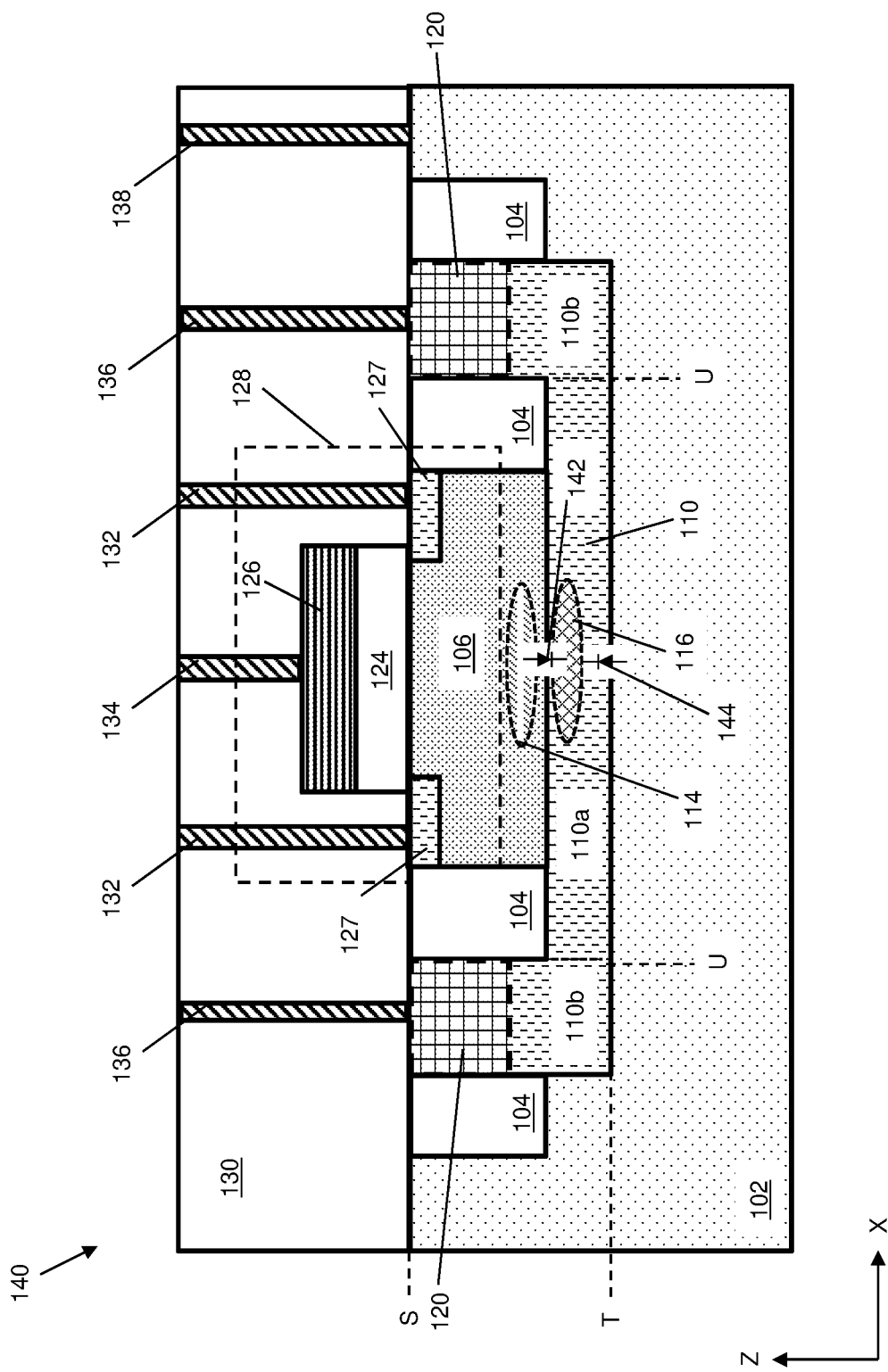
FIG. 7 provides a cross-sectional view of an IC structure with body contacts to the second doped well according to embodiments of the disclosure.

One or more trench isolations (TIs) 104 may be formed in selected areas of substrate 102 to define electrical boundaries between various subsequently-formed elements. TIs 104 may be provided in the form of shallow or deep trench isolations, that is, TIs 104 may have varying depths within substrate 102 in some implementations. TIs 104 may be provided by forming a trench within selected portions of substrate 102 and filling the trench with an insulating material such as oxide, to isolate one region of the substrate from an adjacent region of the substrate. One or more of TIs 104 shown in FIG. 1 may be portions of a single region of TI 104 material, having a looping geometry (e.g., ring, hollow polygon, etc.). In such cases, TI 104 may be formed circumferentially about first doped well 106 (e.g., as shown in FIG. 7 and discussed elsewhere herein). TI(s) 104 may have top surfaces that are substantially coplanar with top surface S of substrate 102, e.g., by planarizing the TI 104 material once it is formed. Two areas of TI 104 are shown in FIG. 1 as an example, and possible additional regions of TI 104 are shown with dashed lines. Each TI 104 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

Methods according to the disclosure may include introducing dopants into the semiconductor material to form one or more doped regions within substrate 102, in the form of a first doped well 106 having a first doping type. A "dopant" refers to an element introduced into semiconductor to establish either p-type (acceptors) or n-type (donors) conductivity. Usually in doping, a dopant, a dosage and an energy level are specified and/or a resulting doping level may be specified. A dosage may be specified in the number of atoms per square centimeter ($cm^2$) and an energy level (specified in keV, kilo-electron-volts), resulting in a doping level (concentration in the substrate) of a number of atoms per cubic centimeter ($cm^3$). The number of atoms is commonly specified in exponential notation, where a number like "3E15" means 3 times 10 to the 15th power, or a "3" followed by 15 zeroes (3,000,000,000,000,000). An example of doping is implanting with B (boron) with a dosage of between about 1E12 and 1E13 atoms/$cm^2$, and an energy of about 40 to 80 keV to produce a doping level of between 1E17 and 1E18 atoms/$cm^3$. Doped portions of a substrate may be known in the art as a "well." A well commonly refers to the implanted/diffused region in semiconductor wafer needed to implement complementary metal oxide semiconductor (CMOS) cell. A "deep well" refers to doped semiconductor material located underneath active device components and/or other wells. Depending on the attributes of a device to be manufactured, first doped well 106 may be either P-type or N-type doped.

According to one example, the first doping type may be P-type doping, and hence first doped well 106 may be known as a "P well." When referring to dopants, P-type dopants refer to elements introduced into semiconductor material to generate free holes by "accepting" electrons from a semiconductor atom and consequently "releasing" the hole. The acceptor atom must have one valence electron less than the host semiconductor. P-type dopants suitable for use in substrate 102 may include but are not limited to: boron (B), indium (In) and gallium (Ga). Boron (B) is the most common acceptor in silicon technology. Further alternatives include In and Ga. Ga features high diffusivity in silicon dioxide ($SiO_2$), and hence, the oxide cannot be used as a mask during Ga diffusion. First doped well 106 may be formed within substrate 102, e.g., by vertical ion implantation at targeted locations (e.g., between areas where TIs 104 are formed). Since first doped well 106 may be formed by doping portions of substrate 102, it may have a top surface that is coplanar with top surface S of substrate 102. In some cases, substrate 102 may also include dopants, which may or may not be the same doping type as first doped well 106. In such cases, first doped well 106 may have the same doping type as substrate 102, but with a higher dopant concentration of the first doping type (e.g., P-type doping) than substrate 102. First doped well 106 thus may be distinguished from substrate 102 at least partially based on their doping concentrations, dopant materials, etc., even where first doped well 106 and substrate 102 are of the same doping type. Substrate 102 may include other doped wells having the same, or different doping types, and such wells are omitted from FIG. 1 solely for clarity.

Figure 2:
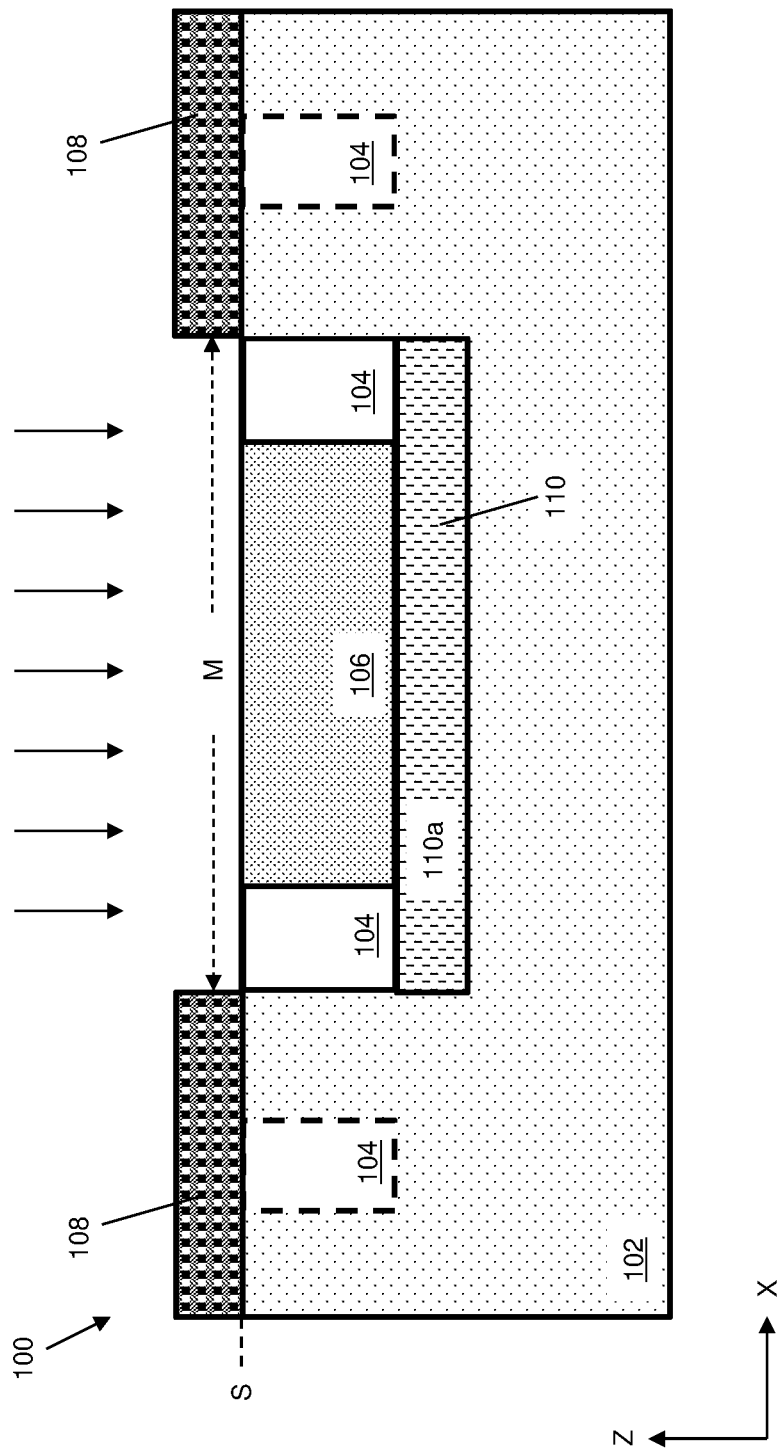
FIG. 2 provides a cross-sectional view of forming a first portion of a second doped well in methods according to the disclosure.

Turning to FIG. 2, continued processing may include forming additional doped wells within substrate 102. A mask 108 may be formed over preliminary structure 100. Mask 108 may include any now known or later developed mask material. Common masking materials are photoresist (resist) and nitride. Nitride is usually classified as a "hard mask." Mask 108 may include a developable organic planarization layer (OPL) on substrate 102, a developable anti-reflective coating (ARC) layer on the developable OPL, and/or a "photoresist mask" layer on the developable ARC layer. Mask 108 includes an opening M. Opening M exposes an area over first doped well 106 and TIs 104 within substrate 102. Mask 108 may cover other portions of substrate 102 (or other TI(s) 104, where applicable), to protect such portions from receiving dopants and/or otherwise being processed.

Methods of the disclosure may include forming a second doped well 110 beneath TI(s) 104 and first doped well 106. Second doped well 110 may have a second doping type that is opposite first doped well 110, e.g., N-type doping in cases where first doped well 106 is doped P-type. Second doped well 110 may be formed by introducing N-type dopants into substrate 102 and/or precursor semiconductor material by any currently known or later developed technique, for doping of materials beneath first doped well 106, e.g., ion implantation. N-type dopants are elements introduced into semiconductor materials to generate free electrons, e.g., by "donating" an electron to semiconductor. N-type dopants must have one more valance electron than the semiconductor. Common N-type donors in silicon (Si) include, e.g., phosphorous (P), arsenic (As), and/or antimony (Sb). The process(es) used to form second doped well 110, may have substantially no effect on the doping and/or composition of overlying materials, including TI(s) 104 and first doped well 106 (e.g., first doped well 106 may continue to have the first doping type after second doped well 110 is formed). A first portion 110a of second doped well may be located beneath TI(s) 104. Additional portions of second doped well 110 may be formed in other processes described herein. First portion 110a of second doped well 110 may be underneath, and in direct contact with, the bottom surface(s) of TI(s) 104 and first doped well 106 thereover.

Figure 3:
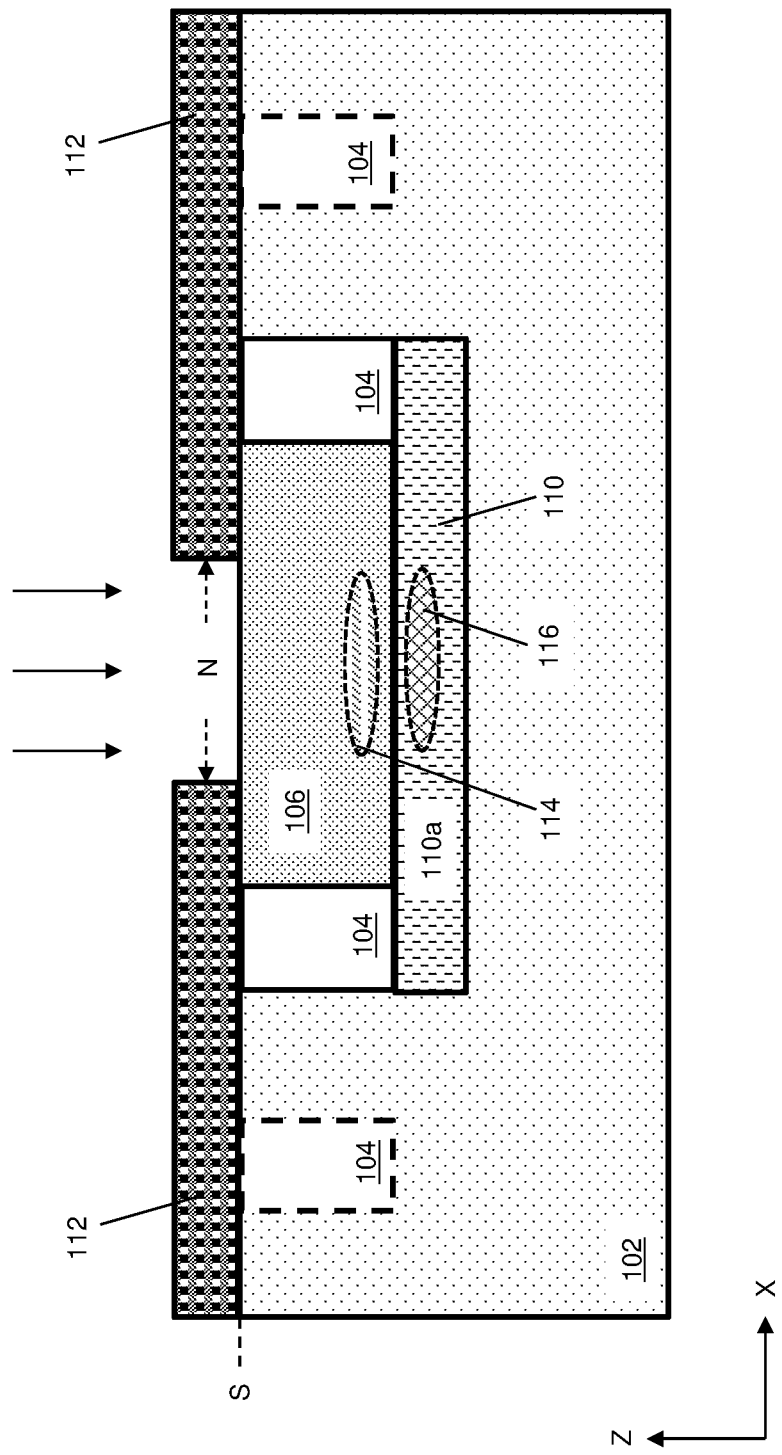
FIG. 3 provides a cross-sectional view of forming dopant extension regions in the first doped well and second doped well according to embodiments of the disclosure.

Referring now to FIG. 3, embodiments of the disclosure optionally may include adjusting the concentration of dopants in targeted portions of first doped well 106 and/or second doped well 110 to control the location of diode junctions. A diode junction refers to the physical interface between two oppositely-doped regions of semiconductor material. The diode effect is modulated by altering the amount of doping on both sides of the junction. According to an example, mask 108 (FIG. 2) may be removed (e.g., by stripping and/or other mask removal processes) and subsequently replaced with a dopant adjustment mask 112. Dopant adjustment mask 112 may include an opening N that is narrower in width, or otherwise differently sized with respect to opening M within mask 108 (FIG. 2). The size of opening N may allow further dopants to be introduced into first doped well 106 and/or second doped well 110, e.g., to create a first dopant extension region 114 in first doped well 106, and a second dopant extension region 116 in second doped well 110. First dopant extension region 114 may have the same doping type as first doped well 106, while second dopant extension region 116 may have the same doping type as second doped well 110. Dopant extension regions 114, 116 may be distinguishable from other portions of doped well(s) 106, 110, by having a substantially higher dopant concentration therein. In this case, a low leakage junction diode forms between first doped well 106 and second doped well 110. Dopant extension regions 114, 116, in some cases, may not be formed in only one respective doped well 106, 110. For instance, it is possible for either of dopant extension regions 114, 116 to horizontally overlap with the other within one or both of doped wells 106, 110. Similarly, dopant extension region(s) 114, 116 may extend into upper portions of doped well 106 and/or gate structure 126, thereby being closer to the location of a set of source/drain regions 127. In some implementations, the forming of dopant extension regions 114, 116 (e.g., with dopant adjustment mask 112) may be omitted. The nested arrangement of doped wells 106, 110 in substrate 102, with the possible addition of dopant extension regions 114, 116, may define a set of diode junctions in the eventual IC structure. The location and polarity of such diode junctions is discussed in more detail elsewhere herein (e.g., with regard to FIG. 6.)

Figure 4:
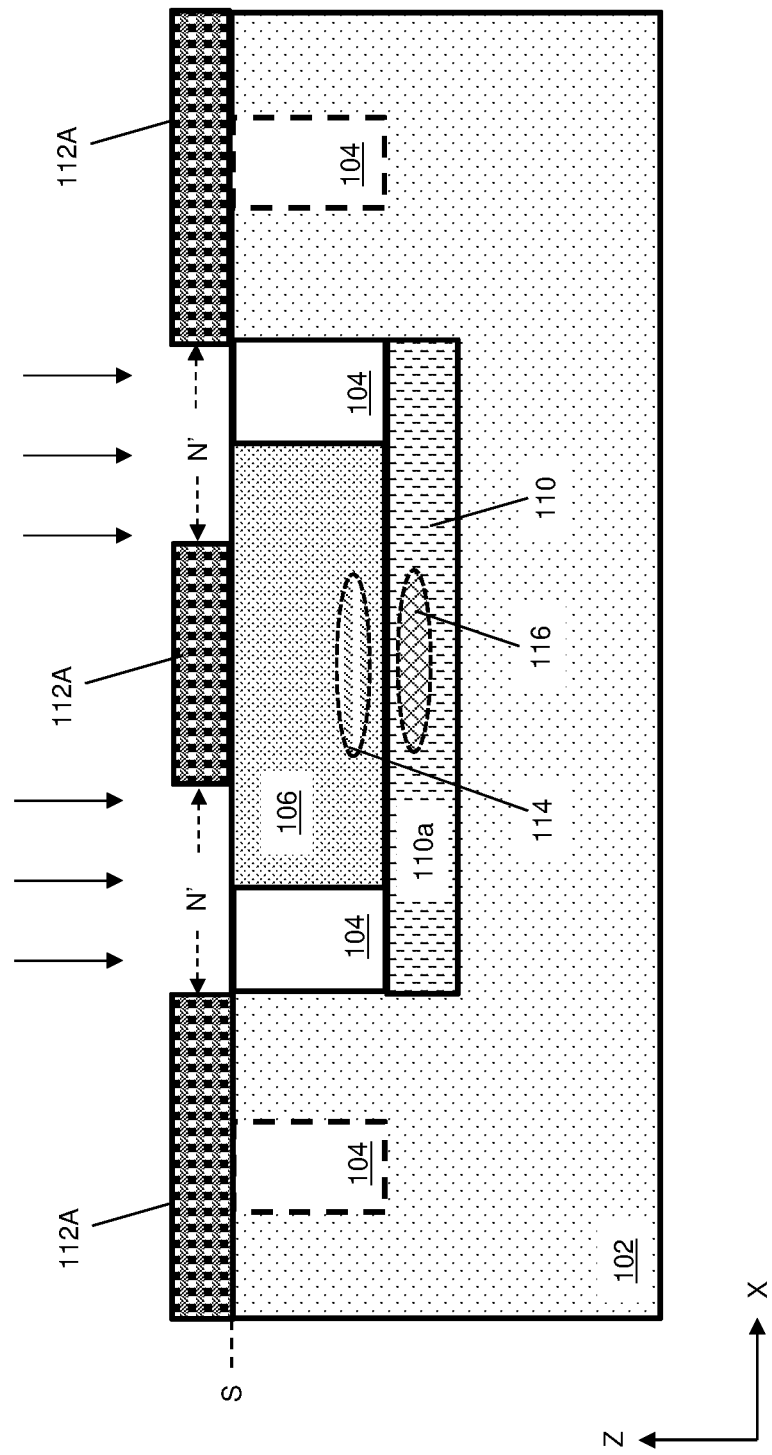
FIG. 4 provides a cross-sectional view of alternate processes to form dopant extension regions in the first doped well and second doped well according to embodiments of the disclosure.

FIG. 4 depicts an alternative arrangement, in which first portion 110a (e.g., using mask 108 in FIG. 2) and the bottom surface of first doped well 106 is doped very lightly. In this case, a further mask 112A may be used to heavily dope the uncovered first portion 110a and a portion of bottom surface of first doped well 106. This process leaves the dopant extension region(s) 114, 116 very lightly doped and creates a diode with high reverse leakage current. Thus, as compared with other configurations, dopant extension regions 114, 116 may have a substantially lower dopant concentration than adjacent portions of doped well(s) 106, 110.

Figure 5:
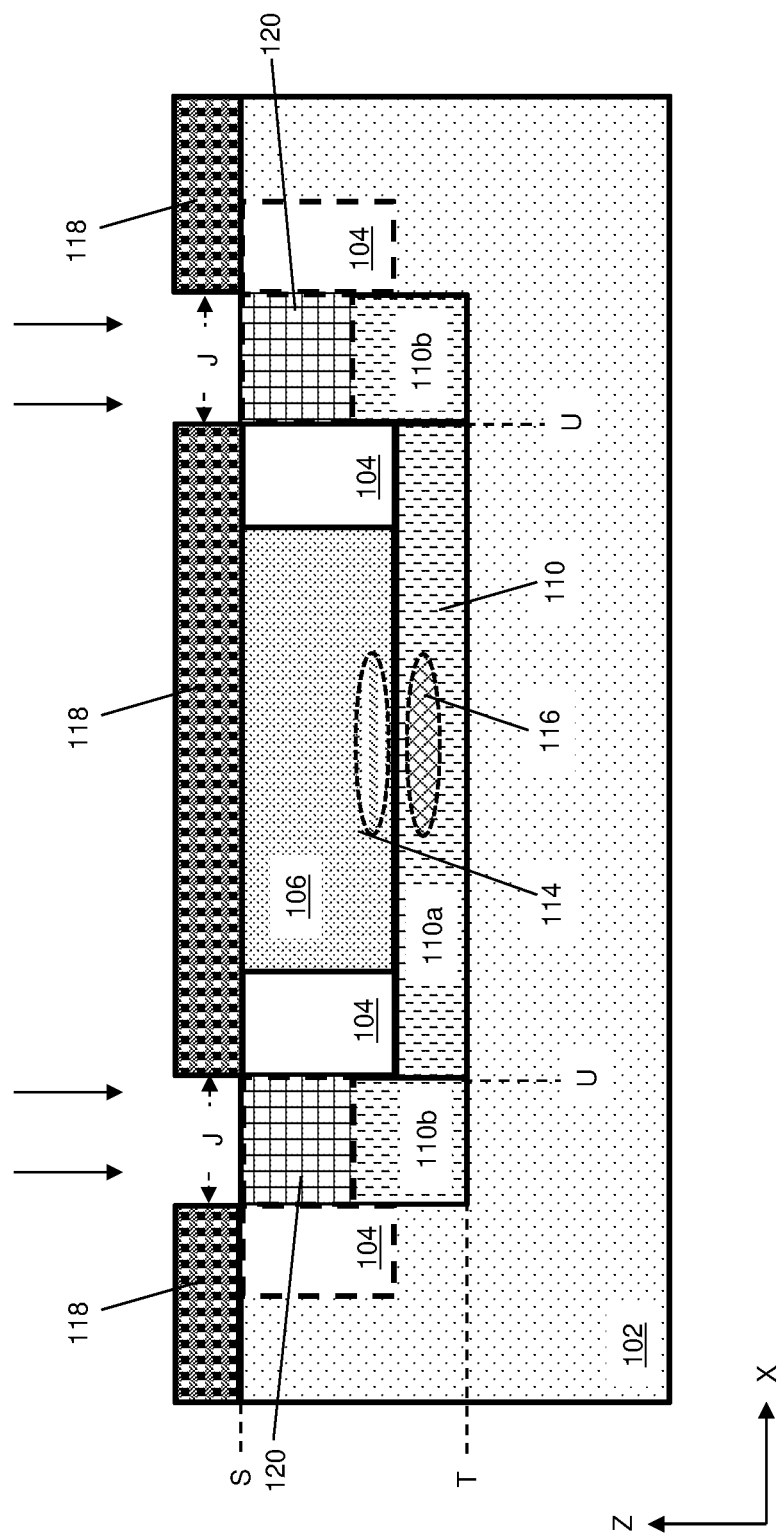
FIG. 5 provides a cross-sectional view of forming a second portion of the second doped well, and an optional resistive region, according to embodiments of the disclosure.

FIG. 5 depicts the additional doping of substrate 102, and the forming of additional materials to control electrical biasing of the eventual IC structure. Here, mask 112 (FIG. 3) may be replaced with a well mask 118 (e.g., having the same composition or a similar composition as mask(s) 108 (FIG. 2), 112. Well mask 118 may include one or more openings J over a location adjacent TI(s) 104. In some cases, opening(s) J may horizontally surround TI(s) 104. In cases where multiple TI(s) 104 are formed, opening(s) J may be over a portion of substrate 102 that is horizontally between multiple TI(s) 104. Additional dopants of the second doping type (e.g., N-type doping) may be introduced into substrate 102, similar to how first portion 110a of second doped well 110 is formed, or by any other suitable technique. The introducing of dopants into substrate 102 below opening J of well mask 118 may form one or more second portions 110b of second doped well 110. Second portion(s) 110*b* may extend vertically from top surface S of substrate 102, or otherwise from resistive region 120, to a bottom surface T within substrate 102. In this case, bottom surface T is substantially coplanar with the bottom surface of first portion 110*a*. In this configuration, second portion(s) 110*b* may have a sidewall U that horizontally abuts first portion 110*a* of second doped well 110, and STI(s) 104 there over. As will be discussed in further detail herein, sidewall U of second portion(s) may horizontally surround first portion 110*a* and/or TI(s) 104.

With continued reference to FIG. 5, embodiments of the disclosure may include forming resistive materials within second portion 110*b* of second doped well 110. Using mask 118 or another structure, portions of semiconductor material within second portion 110*b* may be intentionally damaged to increase electrical resistance in the damaged regions. Such intentional damaging of second portion 110*b*, when implemented, may include introducing Argon (Ar), Xenon (Xe), and/or other molecules (e.g., by implantation) to convert a subsection of second portion of 110*b* into a resistive region 120. Resistive region 120 may include various types of damaged silicon, such as argon-implanted silicon or xenon-implanted silicon, and/or may include other semiconductor materials that are more resistive than remaining portions of second doped well 110. The materials used to form resistive region 120, and/or the type of damaging, may be controlled such that resistive region 120 has a desired electrical resistance, e.g., approximately twenty kilohms (ku) to approximately one-hundred megaohms (Me) or more. Second portion 110*b* of second doped well 110 beneath resistive region 120 may act as a conductive region. Forming resistive region 120 in second portion 110*b* of second doped well 110 may allow subsequently-formed contacts to second doped well 110, discussed elsewhere herein, to exhibit less sensitivity in electrical biasing and/or more control over the behavior of transistor structures formed on first doped well 106.

Figure 6:
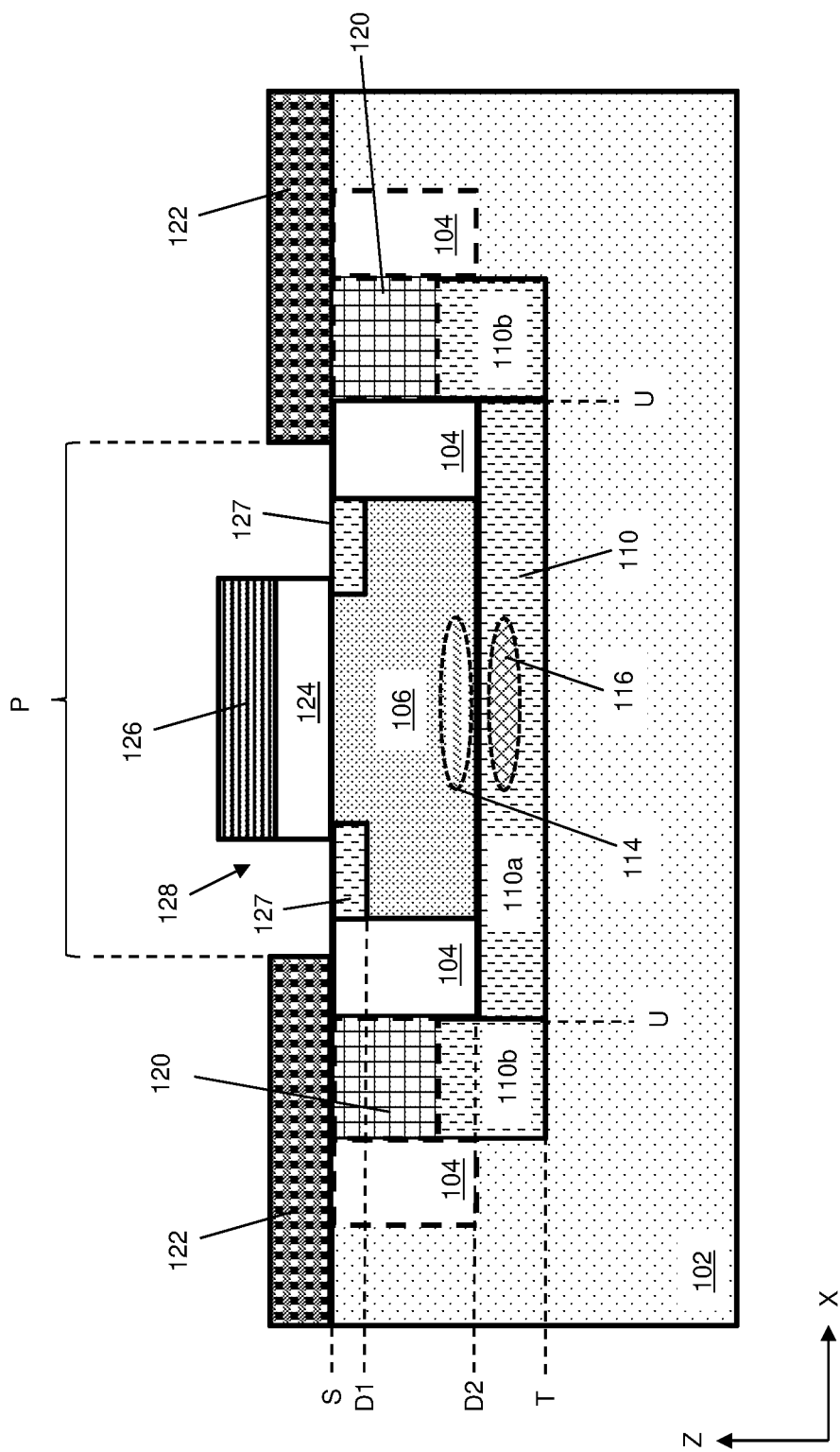
FIG. 6 provides a cross-sectional view of forming a transistor structure according to embodiments of the disclosure.

Turning to FIG. 6, continued processing may include the forming of active device elements on various doped materials in substrate 102. FIG. 6 depicts forming a transistor mask 122 on upper surface S of substrate 102. Transistor mask 122 may replace well mask 118 (FIG. 5), or any other masking materials discussed herein, based on the process order in which various wells and insulative materials are formed in substrate 102. Transistor mask 122 may cover portions of substrate 102, TI(s) 104, and/or second region 110*b* of second doped well 110 (including resistive region 120, where applicable). Transistor mask 122 may have an opening P over first doped well 106, such that various materials may be formed thereon.

Methods of the disclosure may include forming a gate dielectric layer 124 on upper surface S of substrate 102, over first doped well 106. Gate dielectric layer 124 may include a high-k dielectric, such as, but not limited to: metal oxides tantalum oxide ($Ta_2O_5$), barium titanium oxide ($BaTiO_3$), hafnium oxide ($HfO_2$), zirconium oxide ($ZrO_2$), aluminum oxide ($Al_2O_3$) or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity). Gate dielectric layer 124 may include any conceivable insulating material, such as, but not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, hydrogenated silicon oxycarbide (SiCOH), porous SiCOH, porous methylsilsesquioxanes (MSQ), porous hydrogensilsesquioxanes (HSQ), octamethylcyclotetrasiloxane (OMCTS) [$(CH_3)_2SiO]_4$ 2.7 available from Air Liquide, etc., or other low dielectric constant (k<3.9) material, or combinations thereof. Gate dielectric layer 124 may also include high-k dielectric materials, such as, but not limited to, hafnium silicate (HfSiO), zirconium silicate ($ZrSiO_x$), silicon oxynitride (SiON), or any combination of these materials.

Methods of the disclosure may also include forming a gate structure 126 over gate dielectric layer 124 on first doped well 106. Additional dopants may be formed within first doped well 106 in areas adjacent gate dielectric layer 124 to form a set of source/drain (S/D) regions 127 in first doped well 106. Gate dielectric layer 124, gate structure 126, and S/D regions 127 together define a transistor structure 128 on first doped well 106. S/D regions 127 may be formed by introducing dopants of a selected type (e.g., P-type dopants) into substrate 102 by any currently known or later developed technique, as discussed herein with respect to the forming of first doped well 106 and/or second doped well 110. In some cases, the doping to form S/D regions 127 may be implemented with the aid of various additional masks (not shown). S/D regions 127 may have a depth D1 below upper surface that is substantially less than a total depth D2 of first doped well 106. In some cases, D1 may be at most approximately one-tenth the total depth D2 of first doped well 106 (e.g., D1 is at most approximately five nanometers (nm) below upper surface S). Transistor structure 128 may take the form of a field effect transistor (FET) or similar device architecture.

Gate structure 126, during operation, may serve to apply a voltage to first doped well 106 across gate dielectric 124, thereby putting transistor structure 128 in an operational state, e.g., allowing charge carriers to flow between S/D regions 127. Those skilled in the art will appreciate that gate structure 126 may include one or more layers, potentially forming a gate stack. Gate structure 126 may be formed from doped or undoped polycrystalline silicon (poly-Si) according to one example. In further examples, gate structure 126 may include materials such as, but not limited to, aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), tungsten (W), tungsten nitride (WN), tungsten carbide (WC), and/or combinations thereof. Various insulating materials (e.g., spacers) may be included within and/or formed on sidewalls of gate structure 126, but such materials are omitted from FIG. 6 solely for clarity of illustration.

Turning to FIG. 7, embodiments of the disclosure may include forming additional materials for electrical coupling of transistor structure 128 and other structures of other device structures. At this stage, transistor mask 122 (FIG. 6) and/or any other remaining masking materials may be removed. Continued processing may include forming an inter-level dielectric (ILD) 130 over substrate 102, transistor structure 128, and other elements described herein. ILD 130 may be formed by deposition or other techniques of forming an insulative material on a structure. ILD 130 may include the same insulating material as TI(s) 104, or may include a different electrically insulative material. ILD 130 and TI(s)

104 nonetheless constitute different components, e.g., due to TI(s) 104 being formed within trenches of substrate 102 instead of being formed thereon. Additional metallization layers (not shown) may be formed on ILD 130 during middle-of-line and/or back-end-of-line processing.

To electrically couple transistor structure 128 to such metallization layers, a set of S/D contacts 132 may be formed on S/D regions 127 and within ILD 130. Similarly, a gate contact 134 may be formed on gate structure 126 and within ILD 130. Additionally, one or more body contacts 136 may be formed to second portion 110b of second doped well 110 (e.g., on resistive region 120 therein), and within ILD 130. In some cases, a substrate contact 138 also may be formed to substrate 102, e.g., for connecting of substrate 102 to ground or a distinct biasing voltage. Contact(s) 132, 134, 136, 138 may be formed within predetermined portions of ILD 130 by a controlled amount of vertical etching to form openings to one or more contact sites, and then filling the openings with a conductor. Contact(s) 132, 134, 136, 138 may include any currently known or later developed conductive material configured for use in an electrical contact, e.g., copper (Cu), aluminum (Al), gold (Au), etc. Contact(s) 132, 134, 136, 138 may additionally include refractory metal liners (not shown) positioned alongside ILD 130 to prevent electromigration degradation, shorting to other components, etc. Additionally, selected portions of second doped well 110, resistive region 120, gate structure 126, and/or S/D regions 127 may include silicide regions, i.e., portions of semiconductor that are annealed in the presence of an overlying conductor to increase the electrical conductivity of semiconductor regions from contact(s) 132, 134, 136, 138.

Embodiments of the disclosure provide an IC structure 140, which may be producible via one or more example methodologies described herein. IC structure 140 includes two doped wells (first doped well 106, second doped well 110), with body contact 136 being operable to electrically bias first doped well 106 beneath transistor structure 128. IC structure 140 includes, e.g., substrate 102, first doped well 106 of the first doping type within substrate 102, with substrate 102 and first doped well 106 each having substantially coplanar top surfaces (e.g., along top surface S of substrate 102). Transistor structure 128 is on first doped well 106, e.g., with S/D regions being formed in first doped well 106 to first depth D1 (FIG. 1) below top surface S. TI(s) 104 may be within first doped well 106, and in some cases may be horizontally adjacent transistor structure 128. In some cases, TI(s) 104 may have the same depth as first doped well 106, or may extend to a depth below upper surface S that is less than total depth D2 (FIG. 6) of first doped well 106, and such implementations are described elsewhere herein.

IC structure 140 may include second doped well 110, of the second doping type opposite first doped well 106, within substrate 102 under the bottom surface first doped well 106 (i.e., below total depth D2). First portion 110a of second doped well 110 may be entirely underneath first doped well 106, while second portion 110b of second doped well may be alongside first portion 110a, first doped well 106, and TI(s) 104 (e.g., at sidewall U). The vertical boundary between first doped well 106 and second doped well 110 (e.g., at first portion 110a thereof) may define a first diode junction 142. First diode junction 142 may arise from the opposite P-type and N-type doping within doped wells 106, 110, as discussed herein, and/or may be further defined by the location of dopant extension regions 114, 116. First diode junction 142 may permit current flow in only one direction (e.g., from first doped well 106, 110) to allow electrical biasing of first doping well 106 through first diode 142. IC structure 140 further may include a second diode junction 144 between substrate 102 and second doped well 110. Second diode junction 144 similarly arise from second doped well 110 having an opposite doping type from substrate 102, and in some cases, the presence of dopant extension region 116. Similar to first diode junction 142, second diode junction 144 may permit current flow between substrate 102 and second doped well 110 in only one direction to prevent any unwanted electrical signal from the substrate 102 reaching transistor structure 128, for stronger biasing of first doped well 106 through second doped well 110.

To electrically bias the body (i.e., first doped well 106) of transistor structure 128, IC structure 140 may include body contact 136 to second doped well 110. Body contact 136 may be coupled to second portion 110b of second doped well 110 directly, and/or through resistive region 120 thereon. By electrically biasing first doped well 106 through second doped well 110, an operator of IC structure 140 can influence the electrical gain and/or linearity of transistor structure 128 during operation. Applying a reverse (i.e., positive voltage) bias to second doped well 110 through body contact 136 may increase the voltage gain (i.e., ratio of gate voltage to source/drain voltage) of transistor structure 128, relative to when there is no body bias applied to second doped well 110. Conversely, applying a forward (i.e., negative voltage) bias to second doped well 110 through body contact 136 may cause the voltage gain of transistor structure 128 to exhibit a comparatively linear curve with respect to changing gate voltages. Such behavior is distinct from transistor structures that lack such a configuration of doped wells 106, 110 and body contact(s) 136 to second doped well 110.

Figure 8:
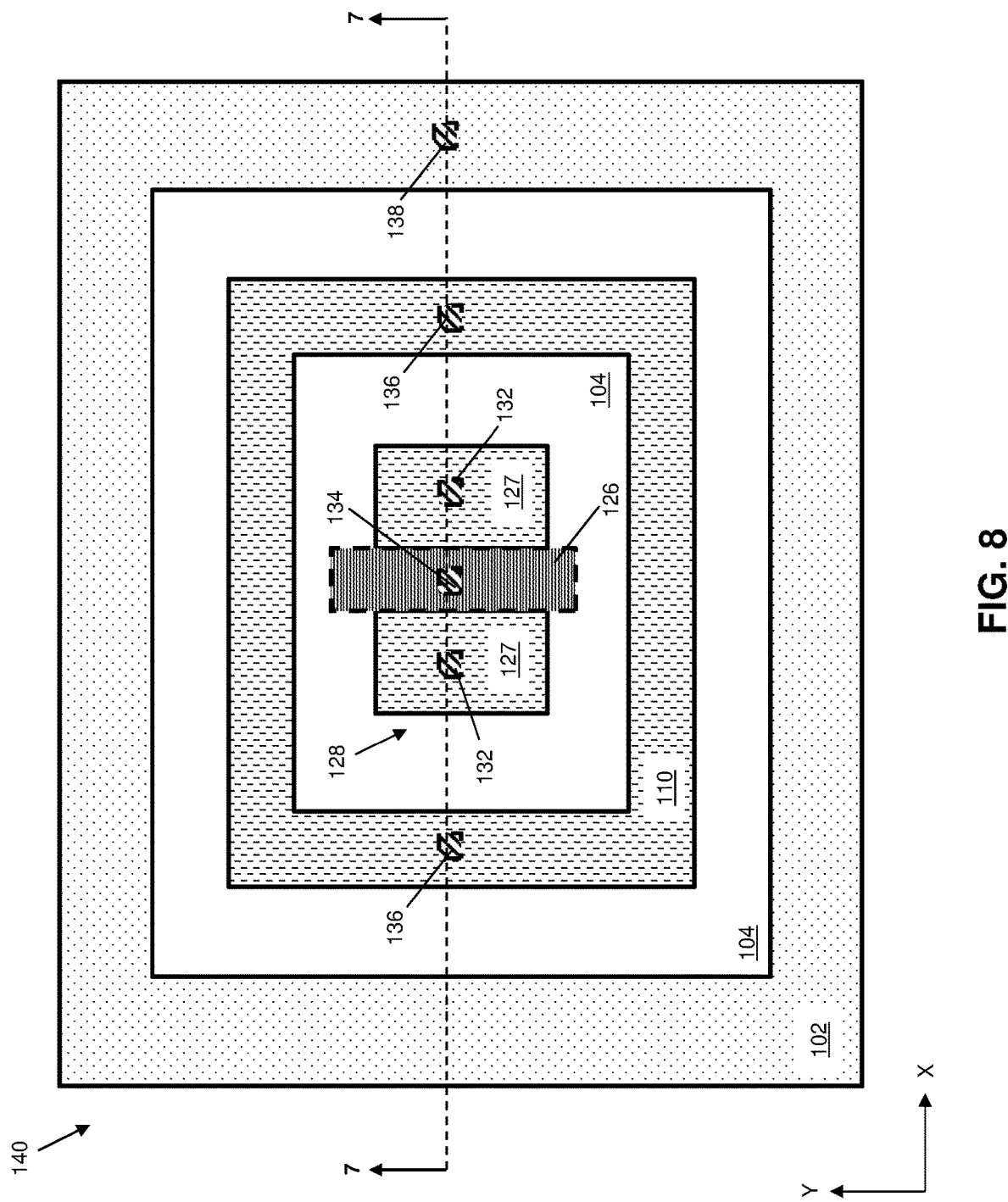
FIG. 8 provides a plan view of the IC structure with body contacts to the second doped well according to embodiments of the disclosure.

Referring to FIGS. 7 and 8, in which FIG. 7 depicts a cross-section IC structure 140 along view line 7-7 in FIG. 8, embodiments of IC structure 140 may be arranged such that body-biasing elements (e.g., second doped well 110) and/or accompanying insulative elements (e.g., TI(s) 104) horizontally enclose transistor structure 128. For instance, IC structure 140 may include a looping TI 104, which horizontally surrounds and thus encloses transistor structure 128. In this case, portions of second doped well 110 may horizontally surround and thus enclose TI 104. In this case, second doped well 110 may be substantially cup-shaped (i.e., it features a scyhoid geometry) as apparent from the cross-section in FIG. 7 and the plan view in FIG. 8. For further isolation between second doped well 110 and substrate 102, another TI 104 may horizontally surround and thus enclose portions of second doped well 110. Although TIs 104 and second doped region 110 are shown to have rectangular profiles in plane X-Y in FIG. 8, any conceivable geometry (e.g., ring-shaped profiles, and/or various polygonal profiles) are possible in further implementations.

Figure 9:
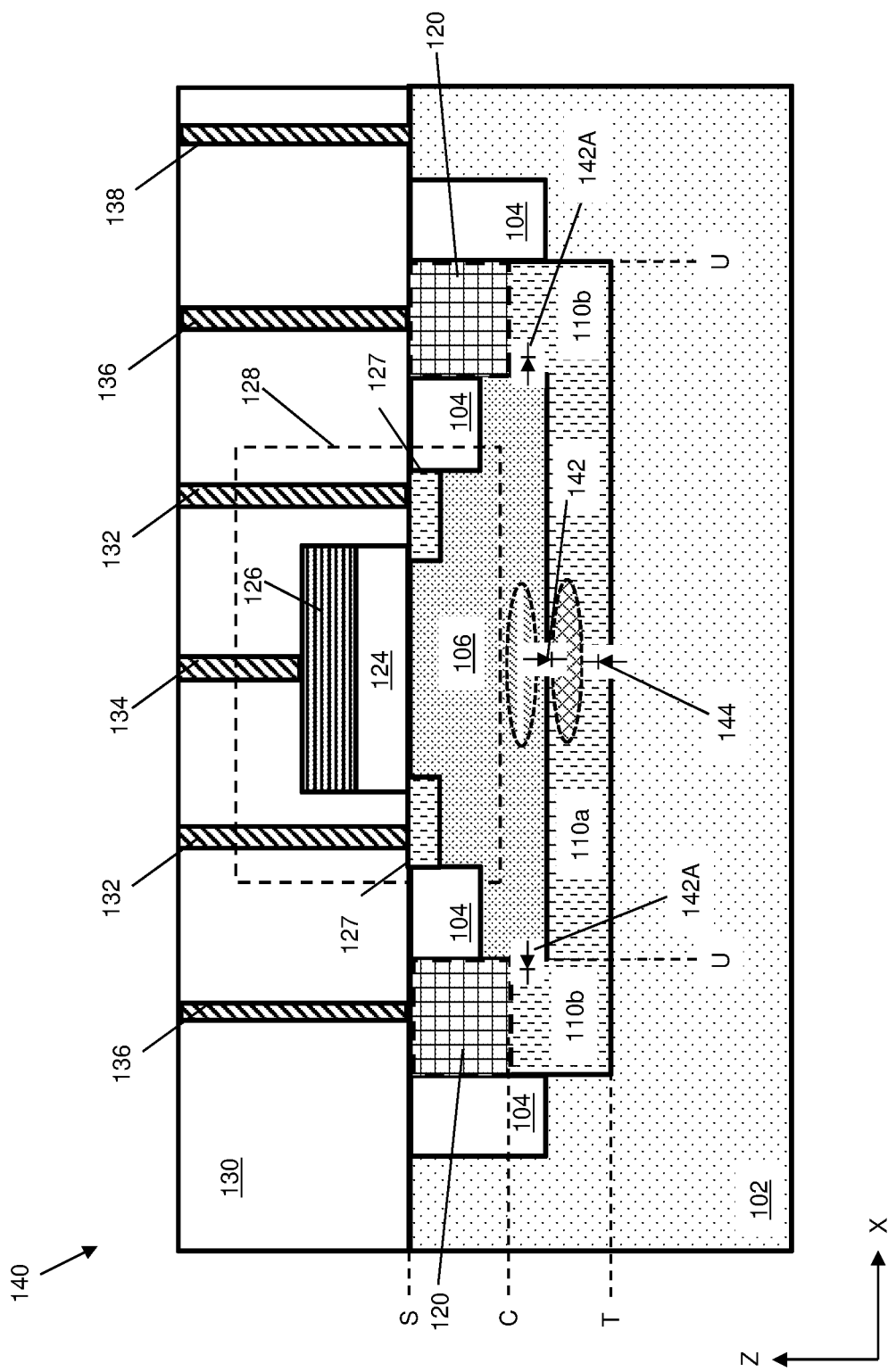
FIG. 9 provides a cross-sectional view of an IC structure according to further embodiments of the disclosure.

A further configuration of IC structure 140 is shown in FIG. 9. Redundant explanation of various elements of IC structure 140 as depicted in FIG. 9 is omitted. The cross-section of IC structure 140 shown in FIG. 9 depicts first doped well 106 as extending underneath bottom surface C of TI(s) 104, such that portions of first doped well 106 are vertically between second doped well 110 and TI(s) 104. Limiting the depth and/or size of TI(s) 104, as shown in the FIG. 9 configuration, may increase the physical interface between first doped well 106 and second doped well 110, thereby increasing the size of first diode junction 142 there between. In another case, if the depth of TI 104 is smaller than the depth of high resistive region 120, a junction diode 142A will appear in parallel with existing first diode 142. Junction diode 142A is formed between the damaged second doped well and first doped well 106. Such a configuration may be desirable, e.g., where stronger biasing of first doped well 106 through second doped well 110 and body contact 136 is desired. In all other respects, IC structure 140 may be structured similarly or identically to other configurations of IC structure 140 described herein.

Figure 10:
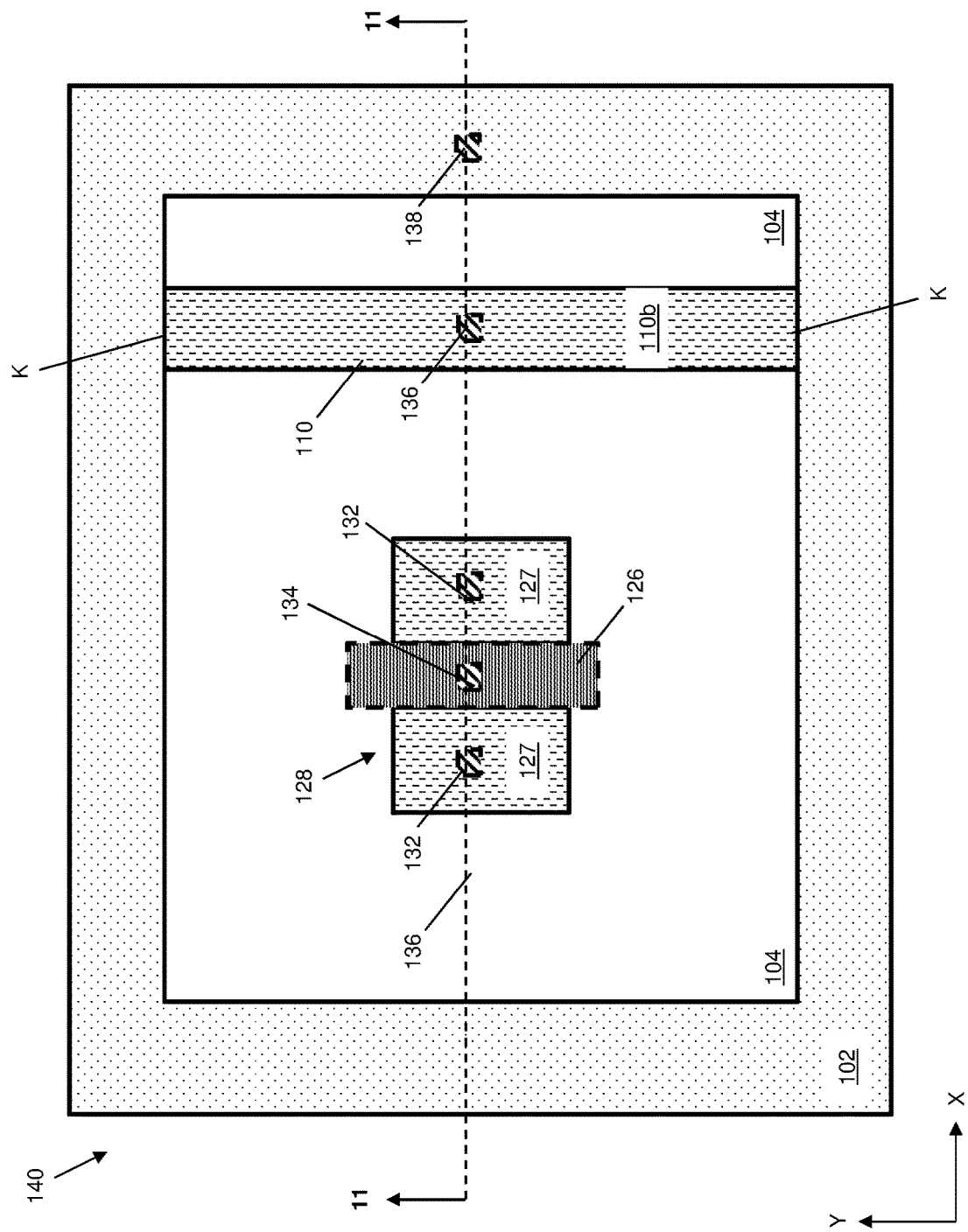
FIG. 10 provides a plan view of the IC structure according to other embodiments of the disclosure.
Figure 11:
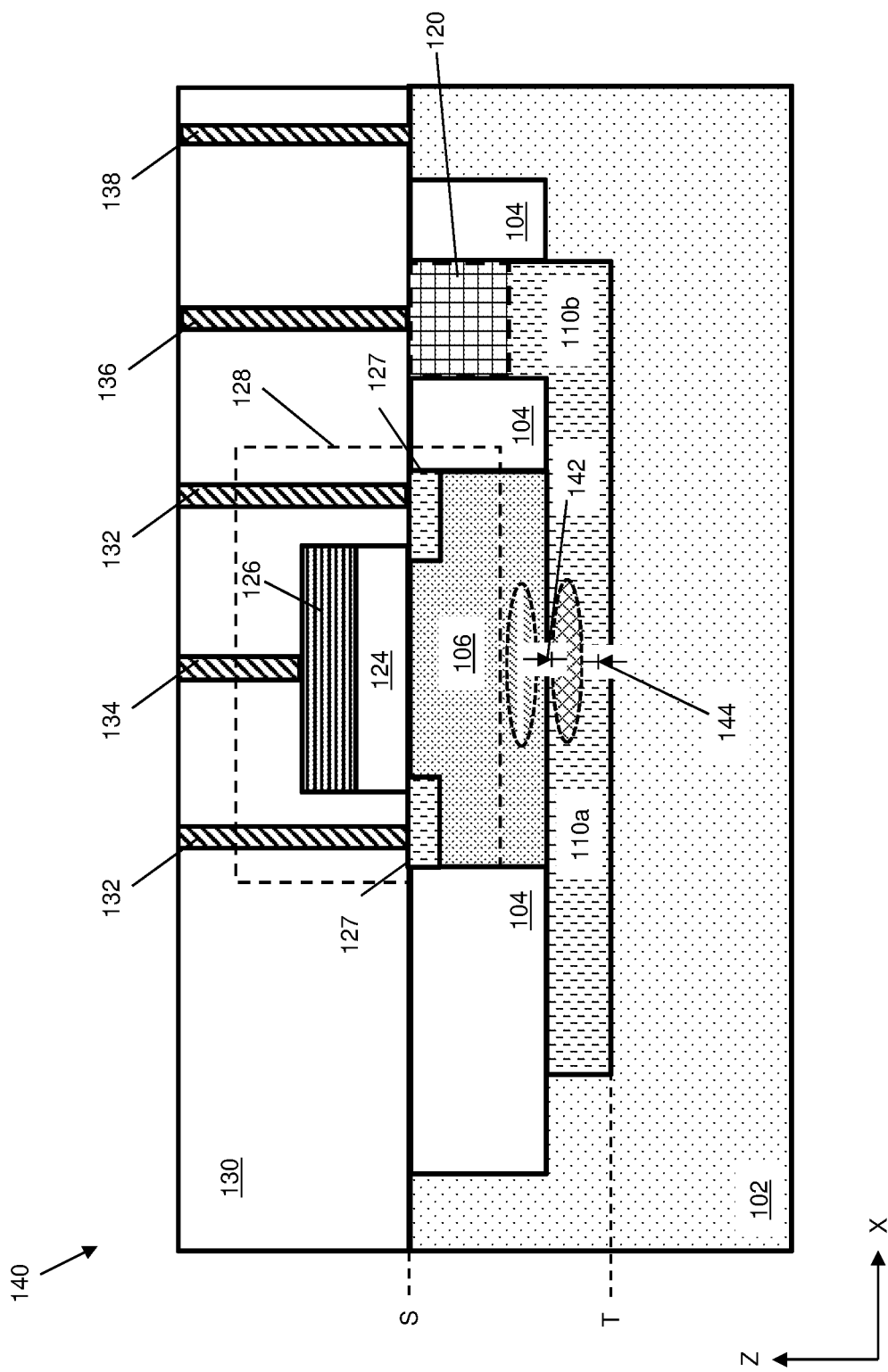
FIG. 11 provides a cross-sectional view of the IC structure according to other embodiments of the disclosure.

Still further configurations of IC structure 140 are shown in FIGS. 10 and 11, in which FIG. 11 provides a cross-sectional view along view line 11-11 of FIG. 10. Redundant explanation of various elements of IC structure 140 as depicted in FIGS. 10, 11 is omitted. In some device configurations (e.g., IC floorplans with floorplans and/or other design configurations with distinct dopant profiles), second doped well 110 may not horizontally enclose TI(s) 104 and/or first doped well 106. As shown in FIG. 10, second doped well 110 may extend horizontally across TI(s) 104 between two interior sidewalls K of substrate 102. In this case, second portion 110*b* of second doped well 110 may be horizontally distal to transistor structure 128 in IC structure 140. As shown in FIG. 11, however, first portion of 110*a* may extend horizontally outward from second portion 110*b* (e.g., along X-axis) and below first doped well 106, thereby forming diode junctions 142, 144 at the physical interface between second doped well 110 and each of substrate 102, first doped well 106. In this case, portions of TI(s) 104 may have a larger horizontal width than in other implementations of IC structure 140, due to the absence of additional second doped well 110 material in such locations.

Figure 12:
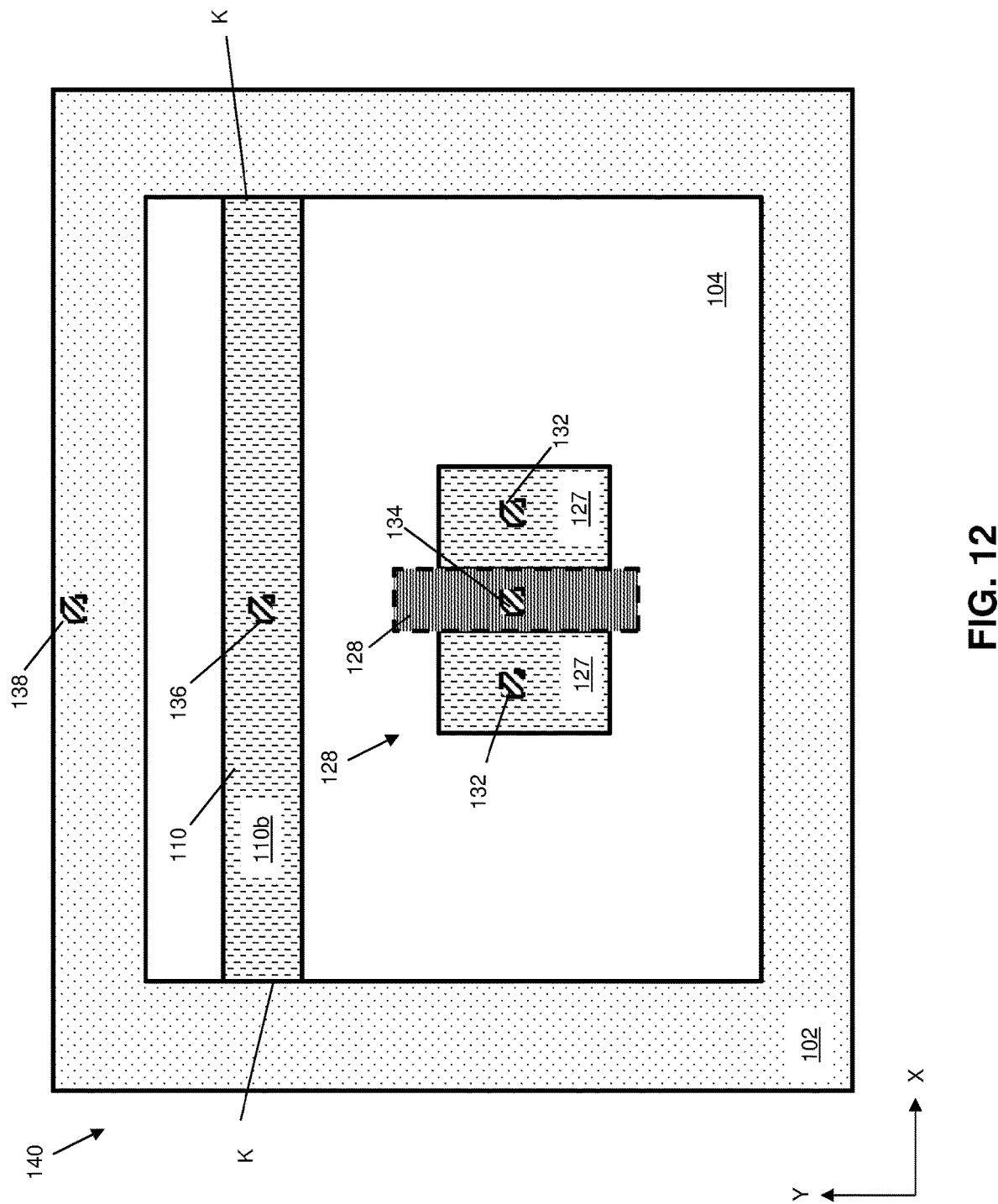
FIG. 12 provides a plan view of the IC structure according to additional embodiments of the disclosure.
Figure 13:
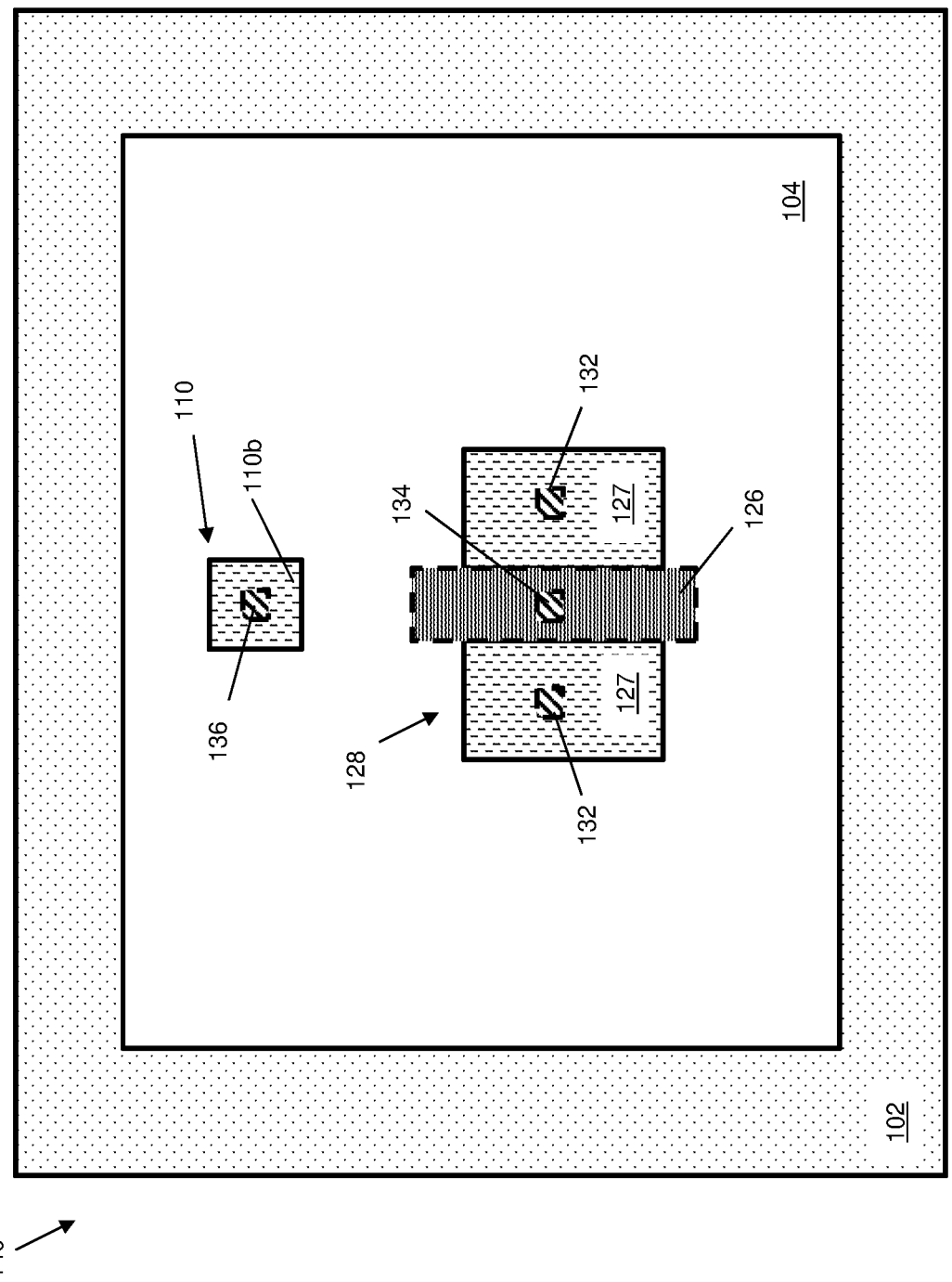
FIG. 13 provides a plan view of an IC structure according to still further embodiments of the disclosure.

Referring briefly to FIGS. 12 and 13, plan views of IC structure 140 according to further implementations are provided. The additional examples provided in FIGS. 12 and 13, are substantially similar to other implementations discussed herein (e.g., those depicted in FIGS. 10 and 11), and discussed as examples to indicate further possible modifications to one or more elements of IC structure 140. FIG. 12, for example, depicts an implementation in which second portion 110*b* of second doped well 110 extends from left-to-right along the X-axis between two interior sidewalls K of substrate 102. In this case, second doped well 110 may continue to include first portion 110*a* (FIGS. 1-7, 9, 11) below first doped well 106 (FIGS. 1-7, 9, 11), in a manner similar to the FIG. 11 cross-section discussed herein. In a further example depicted in FIG. 13, second portion 110*b* of second doped well 110 may be formed in an island-type area within TI 104, such that TI 104 horizontally encloses second portion 110*b*. The island-type area can be placed anywhere (perpendicular, parallel or diagonal to gate structure 126) within TI 104. Here, second doped well 110 does not horizontally abut any portion of substrate 102 (e.g., as shown in FIGS. 10 and 11). However, similar to other embodiments discussed herein, second doped well 110 may feature first portion 110*a* that extends horizontally below transistor structure 128 for electrical biasing of first doped well 106. Despite apparent differences in the plan views shown in FIGS. 12 and 13, IC structure 140 may otherwise operate substantially similarly or identically to other implementations discussed herein. Moreover, resistive region 120 (FIGS. 3-7, 9, 11) still may be formed wherever desired in second portion 110*b* of second doped well 110 in such implementations.

Embodiments of the disclosure may provide several technical and commercial advantages, examples of which here discussed herein. The ability to form a floating body (i.e., first doped well 106) under transistor structure 128, with only one other doped region (i.e., second doped well 110) in substrate 102 allows embodiments of IC structure 140 to have adjustable voltage gain and linearity, based on whether a forward or reverse voltage bias is applied to second doped well 110. These characteristics may be valuable in several technical applications. For instance, in a low noise amplifier (LNA) or power amplifier (PA) circuit, distinct transistors within the circuit may need a high voltage gain or linearity as possible during operation to ensure low noise and sufficient amplification. In such applications, embodiments of IC structure 140 may be used to provide several transistors, each of which may have distinct forward or reverse biasing to achieve the desired characteristics. Another technical application for IC structure 140 may include, e.g., radio frequency (RF) switches, where highly controllable resistance is needed to ensure RF signal isolation. In such cases, the presence of resistive region 120 may allow for a relatively simple integration of desired electrical resistance into a transistor structure, while still allowing a forward or reverse voltage bias to the body of a transistor during operation.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/31 10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure, comprising:
   a first doped well within a substrate, the first doped well having a first doping type;
   a transistor structure on the first doped well;
   a first dopant extension region within the first doped well, the first dopant extension region having the first doping type in a higher concentration than an adjacent portion of the first doped well;
   a trench isolation (TI) adjacent a portion of the first doped well; and
   a second doped well within the substrate and coupled to a body contact, the second doped well having a second doping type opposite the first doping type, wherein a sidewall of the TI horizontally abuts the second doped well, a boundary between the second doped well and the first doped well defines a first diode junction, and a boundary between the second doped well and the substrate defines a second diode junction.

2. The IC structure of claim 1, wherein the second doped well includes:
   a resistive region beneath the body contact to the second doped well, and having a sidewall horizontally adjacent the TI; and
   a conductive region beneath the resistive region.

3. The IC structure of claim 1, wherein the adjacent portion of the first doped well is vertically between a bottom surface of the TI and an underlying portion of the second doped well.

4. The IC structure of claim 1, wherein the TI horizontally surrounds the first doped well, and a portion of the second doped well horizontally surrounds the TI.

5. The IC structure of claim 1, wherein the transistor structure includes a set of source/drain regions within the first doped well, and wherein a depth of the set of source/drain regions within the first doped well is at most approximately one-tenth of a depth of the first doped well from a top surface of the substrate.

6. The IC structure of claim 1, wherein the dopant extension region is adjacent the first diode junction, the boundary between the second doped well and the first doped well is a first vertical boundary, and the boundary between the second doped well and the substrate is a second vertical boundary.

7. The IC structure of claim 1, wherein the second doped well includes a second dopant extension region adjacent the first diode junction, the second dopant extension region having the second doping type in a different concentration than an adjacent portion of the second doped well.

8. An integrated circuit (IC) structure, comprising:
   a first doped well within a substrate, the first doped well having a first doping type;
   a transistor structure on the first doped well;
   a first dopant extension region within the first doped well, the first dopant extension region having the first doping type in a higher concentration than an adjacent portion of the first doped well;
   a trench isolation (TI) adjacent a portion of the first doped well;
   a second doped well within the substrate, the second doped well having a second doping type opposite the first doping type, wherein the second doped well includes:
   a first portion beneath the first doped well, wherein a boundary between the first portion of the second doped well and the first doped well defines a first diode junction, and a boundary between the first portion of the second doped well and the substrate defines a second diode junction, and
   a second portion coupled to a body contact and having a bottom surface substantially coplanar with a bottom surface of the first portion, wherein the second portion includes a sidewall adjacent the first portion of the second doped well and adjacent the TI.

9. The IC structure of claim 8, wherein the second portion of the second doped well includes:
   a resistive region beneath the body contact to the second doped well; and
   a conductive region beneath the resistive region.

10. The IC structure of claim 8, wherein the adjacent portion of the first doped well is vertically between a bottom surface of the TI and the first portion of the second doped well.

11. The IC structure of claim 8, wherein the TI horizontally surrounds the first doped well, and the second portion of the second doped well horizontally surrounds the TI.

12. The IC structure of claim 8, wherein the transistor structure includes a set of source/drain regions within the first doped well, and wherein a depth of the set of source/drain regions within the first doped well is at most approximately one-tenth of a depth of the first doped well from a top surface of the substrate.

13. The IC structure of claim 8, wherein the first dopant extension region is adjacent the first diode junction, the boundary between the second doped well and the first doped well is a first vertical boundary, and the boundary between the second doped well and the substrate is a second vertical boundary.

14. The IC structure of claim 8, wherein the second doped well includes a second dopant extension region adjacent the first diode junction, the second dopant extension region having the second doping type in a different concentration than an adjacent portion of the second doped well.

15. A method of forming an integrated circuit (IC) structure, the method comprising:
   forming a first doped well of a first doping type within a substrate
   forming a first dopant extension region within the first doped well, the first dopant extension region having the first doping type in a higher concentration than an adjacent portion of the first doped well;
   forming a trench isolation (TI) adjacent a sidewall of the first doped well;
   forming a second doped well of a second doping type within the substrate, wherein a vertical boundary between the first portion of the second doped well and the first doped well defines a first diode junction, and a vertical boundary between the first portion of the second doped well and the substrate defines a second diode junction;

forming a transistor structure on the first doped well; and forming a body contact to a second portion of the second doped well.

16. The method of claim 15, further comprising forming a resistive region within the second doped well, wherein forming the body contact causes the body contact to be coupled to the resistive region within the second doped well.

17. The method of claim 15, wherein forming the TI includes forming the TI circumferentially about the first doped well.

18. The method of claim 15, wherein forming the transistor structure includes forming a set of source/drain regions within the first doped well to a depth of at most approximately one-tenth of a depth of the first doped well from a top surface of the substrate.

19. The method of claim 15, further comprising forming a second dopant extension region within the second doped well, the second dopant extension region having the second doping type in a higher concentration than an adjacent portion of the second doped well.

\* \* \* \* \*